United States Patent [19]

Chuang et al.

[11] Patent Number: 5,075,566
[45] Date of Patent: Dec. 24, 1991

[54] BIPOLAR EMITTER-COUPLED LOGIC MULTIPLEXER

[75] Inventors: Ching-Te K. Chuang, South Salem; Hyun J. Shin, Mahopac, both of N.Y.

[73] Assignee: International Business Machines Corporation, Armonk, N.Y.

[21] Appl. No.: 628,252

[22] Filed: Dec. 14, 1990

[51] Int. Cl.$^5$ .............................................. H03K 17/62
[52] U.S. Cl. ..................................... 307/243; 307/241
[58] Field of Search .............. 307/463, 467, 239, 240, 307/241, 242, 243; 370/112, 113; 328/104, 137, 154

[56] References Cited

U.S. PATENT DOCUMENTS

| | | | |
|---|---|---|---|
| 2,535,303 | 12/1950 | Lewis | 171/97 |
| 2,576,026 | 11/1951 | Meacham | 171/97 |
| 2,657,318 | 10/1953 | Rack | 307/88 |
| 2,906,869 | 9/1959 | Kramskoy | 250/27 |
| 2,913,528 | 11/1959 | Den Hertog et al. | 179/15 |
| 3,029,310 | 4/1962 | Heiser | 179/15 |
| 3,096,447 | 7/1963 | Hill et al. | 307/88.5 |
| 3,935,385 | 1/1976 | Thun | 370/113 X |
| 4,390,988 | 6/1983 | Best et al. | 370/113 |
| 4,461,960 | 7/1984 | Yasunaga | 307/243 |
| 4,488,063 | 12/1984 | Lee | 307/455 |
| 4,551,634 | 11/1985 | Takahashi et al. | 307/243 |

Primary Examiner—David Mis
Attorney, Agent, or Firm—Perman & Green

[57] ABSTRACT

A high speed multiplexer circuit is described which includes a plurality of input bipolar transistors and a reference bipolar transistor. The input and reference transistors have their emitters commonly coupled to an emitter current supply and their collectors coupled to a collector supply. The collector of the reference transistor is coupled to the collector supply through an impedance. A reference potential is connected to the base of the reference bipolar transistor and biases it for conduction. An input signal to be multiplexed is connected to the base of each of the input bipolar transistors and a diode circuit is coupled between the base of each of the input bipolar transistors and a switch input. A switch input, in a first state, causes the diode circuit to conduct and clamp the base of an input transistor, to prevent it from responding to a signal input. The switch input also manifests a second state which renders the diode circuit non-conductive and enables an input transistor to conduct in response to an input signal. The conduction of an input transistor changes current flow through the reference transistor, which change is reflected across the collector connected impedance and sensed as an output.

6 Claims, 1 Drawing Sheet

BIPOLAR EMITTER-COUPLED LOGIC MULTIPLEXER

FIELD OF THE INVENTION

This invention relates to multiplexer circuits and, in particular, multiplexer circuits which employ bipolar transistors connected in an emitter-coupled logic configuration.

BACKGROUND OF THE INVENTION

The art is replete with multiplexing circuits which employ various types of gating networks to implement the multiplex function. Some circuits employ a cascode series connection of a pair of transistors to provide the switching function. This arrangement requires a larger supply voltage to accommodate voltage shifts which occur through the circuit. In addition, additional circuit features are needed to move the logic levels back within desired limits.

To implement high speed multiplexer functions, bipolar transistors offer the highest speed switching action. In bipolar circuits, however, care must be taken to avoid saturation effects, both in devices which act as gates and devices which accomplish controlled switching of the signals. Furthermore, substantial design efforts are required to minimize silicon real estate devoted to the multiplexing function.

Other types of switching networks are shown in the prior art. In U.S. Pat. Nos. 2,535,303 to Lewis, 2,576,026 to Meacham, and 2,657,318 to Rack, three-diode, T network switches are shown which are connected in a common cathode arrangement. The switching potential is applied to the anode of one diode to cause it to conduct and to attenuate signal transfer between the other two diodes. Such switching circuits are shown implemented in a multiplexer arrangements.

In U.S. Pat. No. 2,906,869 to Kramskoy, an early style multiplexer circuit is shown wherein diode tubes provide inputs to a triode gate. In U.S. Pat. No. 2,913,528 to DenHertog et al., a scanning by provision of a shunt diode having a gating potential applied to its cathode. By using the gating potential to change the conductivity state of the diode, the conductivity state of a series connected gate diode is thereby controlled. In U.S. Pat. No. 3,029,310 to Heiser, a frequency scanned switching circuit is shown which also employs a diode clamp on a signal line as a gating device.

In U.S. Pat. No. 3,096,447 to Hill et al., a switching circuit is shown having gates which are biased by a signal being gated. The Hill et al. switching circuit is controlled by conduction level of a collector-emitter path of a shunt connected transistor.

In U.S. Pat. No. 4,390,988 to Best et al., a multiplexer is shown which employs a plurality of gated field effect transistors as input gates to a many-two-one multiplexing circuit. In U.S. Pat. No. 4,461,960 to Yasunaga, a multiplexing circuit is shown which employs a shunt connected transistor for clamping the base input of a switching stage. In U.S. Pat. No. 4,551,634 to Takahashi et al., an MOS multiplexing circuit is described wherein a shunt MOS device is employed to clamp a connection point between first and second MOS switching transistors.

Accordingly, it is an object of this invention to provide a high speed multiplexing circuit which uses minimum semiconductor real estate.

It is another object of this invention to provide a high speed multiplexing circuit which employs bipolar, emitter coupled logic technology.

It is still another object of this invention to provide a bipolar emitter coupled logic multiplexing circuit whose functioning is controlled by either a multiplexing switch or a decoder circuit.

SUMMARY OF THE INVENTION

A high speed multiplexer circuit is described which includes a plurality of input bipolar transistors and a reference bipolar transistor. The input and reference transistors have their emitters commonly coupled to an emitter current supply and their collectors coupled to a collector supply. The collector of the reference transistor is coupled to the collector supply through an impedance. A reference potential is connected to the base of the reference bipolar transistor and biases it for conduction. An input signal to be multiplexed is connected to the base of each of the input bipolar transistors and a diode circuit is coupled between the base of each of the input bipolar transistors and a switch input. A switch input, in a first state, causes the diode circuit to conduct and clamp the base of an input transistor, to prevent it from responding to a signal input. The switch input also manifests a second state which renders the diode circuit non-conductive and enables an input transistor to conduct in response to an input signal. The conduction of an input transistor changes current flow through the reference transistor, which change is reflected across the collector connected impedance and sensed as an output.

DETAILED DESCRIPTION OF THE INVENTION

Figure 1:
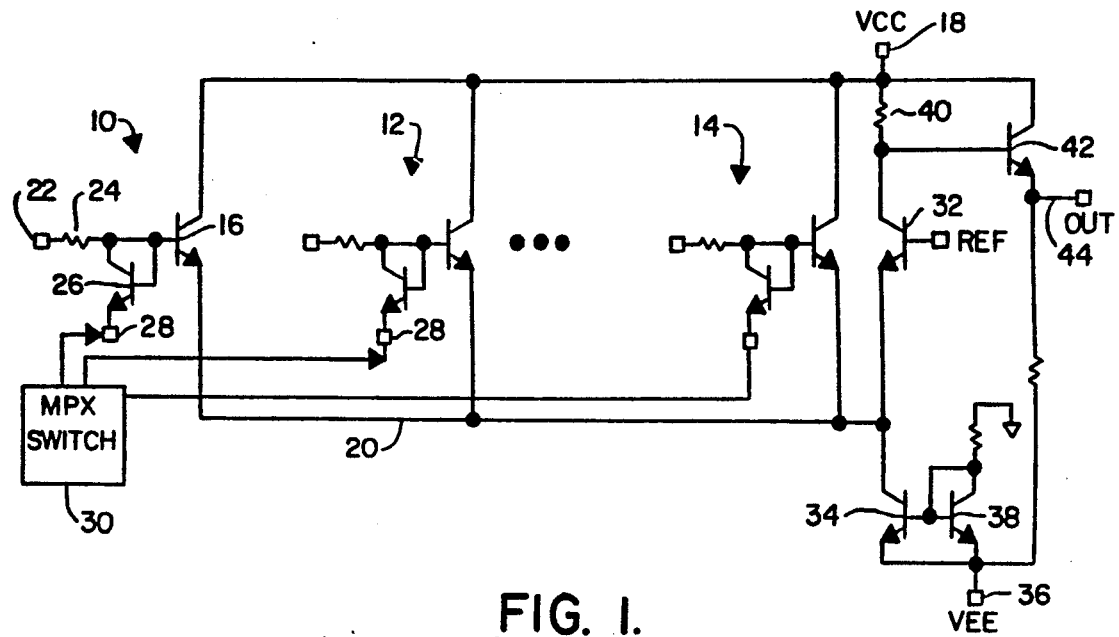
FIG. 1 is a circuit diagram of a multiplexer embodying the invention.

Referring now to FIG. 1, a multiplexer circuit embodying the invention is shown which avoids problems of the prior art e.g., multiple level stacking of current switches; multiple current sources and/or additional circuitry for logic level shifting.

A plurality of input stages 10, 12, 14 etc. are shown, each comprising an NPN, bipolar transistor 16 whose collector is connected to a source of collector voltage Vcc 18, and whose emitter is connected to a common emitter line 20. A signal to be multiplexed is applied to an input terminal 22, which is, in turn, coupled to the base of transistor 16 through a resistor 24. A shunt transistor 26 is connected, in a diode configuration, between the base of transistor 16 and a switch terminal 28. Inputs to switch terminals 28 are generated by a multiplex switch (or decoder) 30 which is configured to produce gating voltages on its output lines so that stages 10, 12, 14 etc. are gated on accordingly.

Common emitter line 20 connects the emitters of transistors 16 in input stages 10, 12, and 14 and the emitter of reference transistor 32. A reference potential is applied to the base of transistor 32 enabling it to operate in the emitter coupled mode with each of transistors 16. The reference potential conditions transistor 32 for conduction in the absence of the conduction of any of input transistors 16.

The emitter of reference transistor 32 is connected through a transistor 34 to a source of emitter potential Vee 36 at terminal 36. Transistor 34, in combination with diode connected transistor 38, provides the necessary current source for the circuit. The collector of transistor 32 is connected through a resistance 40 to collector supply Vcc at terminal 18. The output from the circuit is taken from the connection between the collector of transistor 32 and resistor 40, via transistor 42 which provides an emitter driven output at terminal 44.

As the structure and operation of each input stage to the multiplexer circuit of FIG. 1 is identical, the operation of only one such stage will be discussed, it being realized that the other stages operate identically.

Initially, multiplex switch 30 applies low levels to all input terminals 28, thereby biasing each of diodes 26 to the conductive state. This action clamps the base circuit of each transistor 16 to the low level (plus a diode drop) and renders it non-conductive. Signals to be multiplexed are applied to input terminals 22. Under these conditions, current flows through reference transistor 32 and transistor 34 (between Vcc terminal 18 and Vee terminal 36) in the normal emitter-coupled logic fashion.

When multiplexing action is desired, multiplex switch 30 applies a high level to terminal 28 of diode 26 in input stage 10. Diode 26 is thereby rendered non-conductive, thereby unclamping the base circuit of transistor 16. As a result, transistor 16 conducts in accordance with the level of the input potential at terminal 22. The conduction of transistor 16 raises the potential on common emitter conductor 20 and across transistor 34. As a result of the increased potential, current flow through transistor 32 decreases, thereby causing a rise in its collector potential, which rise increases conduction through output transistor 42 and enables output terminal 44 to rise.

After the input on terminal 22 in input stage 10 has been sampled, multiplex switch 30 drops the level at terminal 28 of stage 10 to the low level, thereby biasing transistor 26 into conduction and again clamping the base circuit of transistor 16. Conduction thereby ceases therethrough. Multiplex switch 30 then applies a high potential to terminal 28 of input stage 12 (or another selected stage) and the multiplexing action continues.

The circuit shown in FIG. 1 provides the advantage that the addition of input channels be multiplexed requires only the addition of three devices (resistor 24, diode 26 and transistor 16). In addition, since a single source of current through transistor 34 is steered through load impedance 40, the circuit does not have the mismatch problem seen in the prior art.

Figure 2:
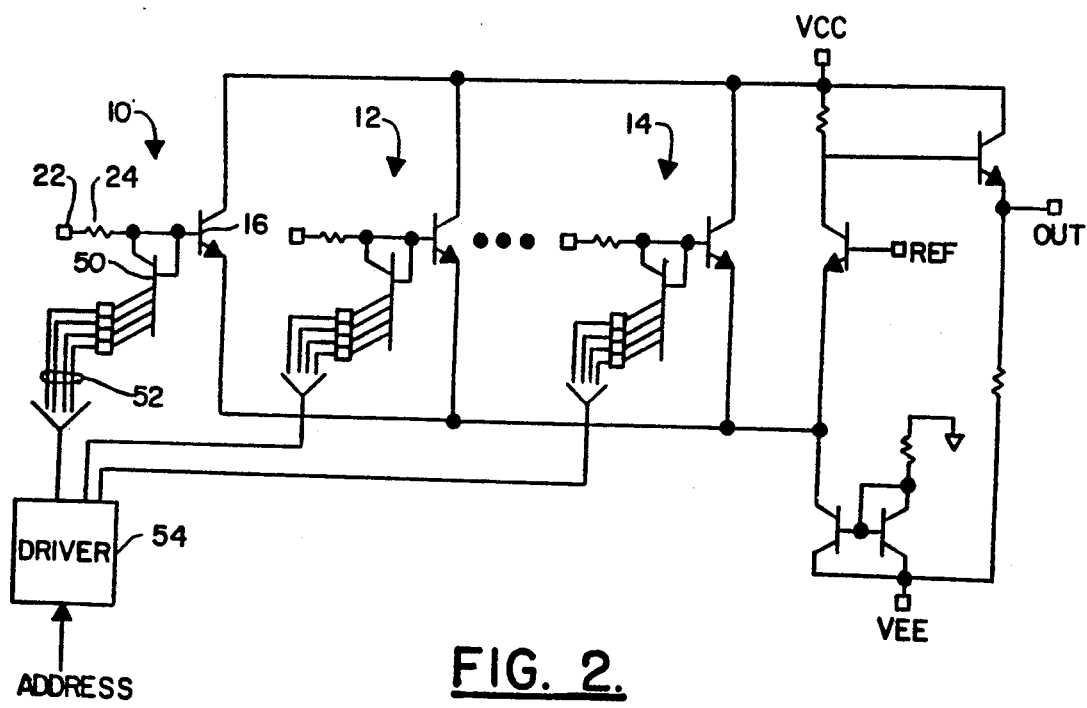
FIG. 2 is a circuit diagram of a multiplexer which embodies the invention and has a built-in decoder function.

Turning now to FIG. 2, a built-in decoding function controls the operation of the multiplexer circuit. In lieu of single emitter transistor 26, a multiple emitter transistor 50 is employed and is connected as a diode to the base circuit of transistor 16. A diode 50 performs the decoding function and becomes forward biased (conductive) when any of encoded address lines 52 is pulled to a low state by driver 54. Thus, only when all of its address lines are in the high state, does multiple emitter diode 50 become nonconductive and enable the associated input stage to be operative. As a result, any one of input stages 10, 12, 14 etc. can be selectively rendered operative, or inoperative by appropriate outputs from driver 54, as applied to lines 52.

It should be understood that the foregoing description is only illustrative of the invention. Various alternatives and modifications can be devised by those skilled in the art without departing from the invention. Thus, while NPN transistors have been shown, those skilled in the art will realize that PNP transistors can also be used, with proper supply potentials. Accordingly, the present invention is intended to embrace all such alternatives, modifications and variances which fall within the scope of the appended claims.

We claim:

1. A high speed multiplexer circuit comprising:
 a plurality of input bipolar transistors and a reference bipolar transistor, all having their emitters commonly coupled to emitter current supply means and their collectors coupled to a collector supply, the collector of said reference transistor coupled to said collector supply via an impedance;
 a reference potential connected to the base of said reference transistor for biasing said reference transistor for conduction;
 an input signal to be switched, connected to the base of each of said input bipolar transistors; and
 diode means coupled between the base of each said input bipolar transistor and a switch input, said switch input, in a first state, causing a said diode means to clamp the base of a connected input bipolar transistor to prevent it from responding to a said input, said switch input in a second state, causing said diode means to unclamp the base of said input bipolar transistor and enabling it to conduct in response to a said input signal, the conduction of said input bipolar transistor altering current flow through said reference transistor, which current flow alteration is reflected across said collector-connected impedance as an output signal.

2. The high speed multiplexer circuit of claim 1 wherein each said diode means comprises:
 a transistor having its base and collector connected, in common, to a base of said input bipolar transistor and its emitter coupled to a switch input.

3. The high speed multiplexer circuit of claim 1 wherein said switch input is produced by a multiplex switch, said switch selectively applying said second state inputs to said diode means, whereby individual ones of input bipolar transistors are enabled to respond to an input applied to their respective base circuits.

4. The high speed multiplexer circuit of claim 1 wherein each said diode means has a plurality of emitter terminals, and said switch input comprises a separate address signal for each said emitter terminal, an address signal exhibiting a first state and applied to an emitter terminal causing said diode means to clamp the base of its connected input transistor.

5. The high speed multiplex circuit of claim 1 wherein each said bipolar transistor is of an identical type.

6. The high speed multiplex circuit of claim 1 wherein only a single collector potential supply and emitter current supply are employed.

* * * * *